(12) United States Patent
Bass

(10) Patent No.: US 10,714,287 B2
(45) Date of Patent: Jul. 14, 2020

(54) FUSE ELEMENT

(71) Applicant: HKR SEUFFER AUTOMOTIVE GMBH & CO. KG, Kupferzell (DE)

(72) Inventor: Wolfgang Bass, Kupferzell (DE)

(73) Assignee: HKR AUTOMOTIVE GMBH (DE)

( * ) Notice: Subject to any disclaimer, the term of this patent is extended or adjusted under 35 U.S.C. 154(b) by 0 days.

(21) Appl. No.: 16/027,475

(22) Filed: Jul. 5, 2018

(65) Prior Publication Data
US 2019/0027329 A1    Jan. 24, 2019

(30) Foreign Application Priority Data
Jul. 18, 2017 (DE) .................... 20 2017 104 268 U

(51) Int. Cl.
*H01H 37/76* (2006.01)
*H05K 1/02* (2006.01)
(Continued)

(52) U.S. Cl.
CPC ......... *H01H 37/761* (2013.01); *H05K 1/0201* (2013.01); *H05K 1/0263* (2013.01); *H05K 3/341* (2013.01); *H01H 2037/046* (2013.01); *H01H 2037/762* (2013.01); *H01H 2037/763* (2013.01); *H05K 2201/0311* (2013.01); *H05K 2201/10181* (2013.01); *H05K 2201/10265* (2013.01)

(58) Field of Classification Search
CPC .... H05K 3/341; H05K 1/0263; H05K 1/0201; H05K 2201/0311; H05K 2201/10265; H05K 2201/10181; H01H 37/761; H01H 2037/763; H01H 2037/762; H01H 2037/046

USPC ......................................................... 337/404
See application file for complete search history.

(56) References Cited

U.S. PATENT DOCUMENTS 2,921,167 A * 1/1960 Dahlen .................. H01H 85/36
337/181
5,280,262 A * 1/1994 Fischer ................ H01H 37/761
337/402
(Continued)

FOREIGN PATENT DOCUMENTS

DE     19639427 A1     3/1997
DE     19647035 A1    11/1997
(Continued)

*Primary Examiner* — Anatoly Vortman
(74) *Attorney, Agent, or Firm* — Ware, Fressola, Magurie & Barber LLP

(57) ABSTRACT

A fuse element for an electric circuit, arranged on a circuit board of the electric circuit, has a surface area for fastening and establishing an electric contact on the circuit board, a first deforming area adjacent the surface area, a second deforming area connected to the first deforming area via a central area, the second deforming area including a contact area that abuts the circuit board, and a hook-shaped element insertable into an opening adjacent the contact area, the hook-shaped element is insertable into the opening by elastic deformation of the fuse element in the direction of the circuit board and, after insertion of the hook-shaped element into the opening and positive holding of the hook-shaped element on a lower surface of the circuit board, the first and second deforming areas exert an elastic force on the surface area in the direction away from the circuit board.

16 Claims, 6 Drawing Sheets

(51) Int. Cl.
*H05K 3/34* (2006.01)
*H01H 37/04* (2006.01)

(56) References Cited

U.S. PATENT DOCUMENTS

| | | | |
|---|---|---|---|
| 5,600,295 A * | 2/1997 | Kaufmann | H01H 37/761 337/402 |
| 5,612,662 A | 3/1997 | Drekmeier et al. | |
| 5,896,080 A * | 4/1999 | Chen | H01H 37/761 337/401 |
| 7,002,785 B1 * | 2/2006 | Bothe | H01H 37/76 361/103 |
| 7,023,674 B2 * | 4/2006 | Gross | H01H 37/761 337/407 |
| 8,665,057 B2 | 3/2014 | Schlenker et al. | |
| 8,749,940 B2 * | 6/2014 | Schmidtlein | H01H 37/761 361/103 |

FOREIGN PATENT DOCUMENTS

| | | |
|---|---|---|
| DE | 102005014601 A1 | 10/2006 |
| DE | 102009046489 A1 | 5/2011 |
| DE | 202012000571 U1 | 4/2012 |
| FR | 2914108 A1 | 9/2008 |

\* cited by examiner

Section X-X

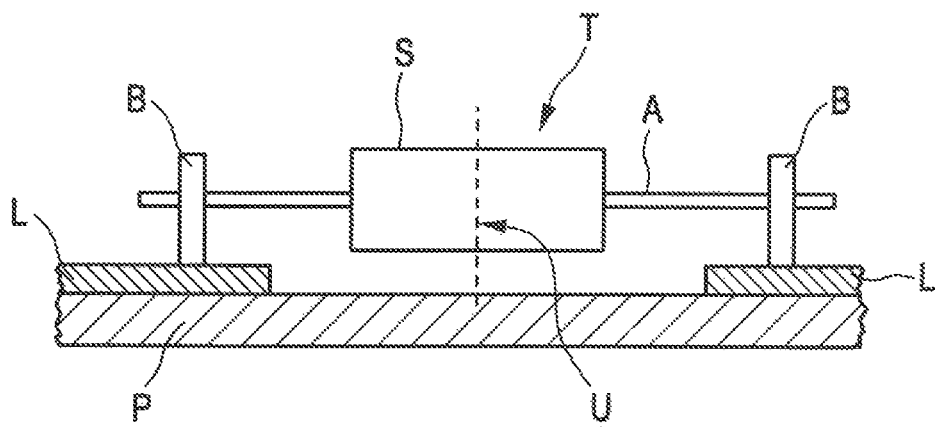
Fig. 8  State of the art
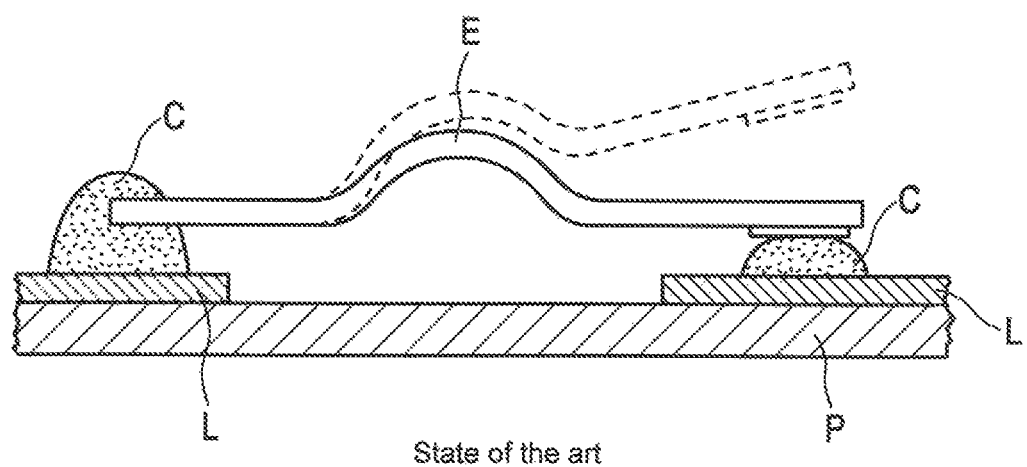
Fig. 9  State of the art

FUSE ELEMENT

CROSS REFERENCE TO RELATED APPLICATION

This application claims priority under 35 USC § 119 to German Patent Application No. 202017104268.5 filed on Jul. 18, 2017, which application is hereby incorporated by reference in its entirety.

TECHNICAL FIELD

The present invention relates to a fuse element for an electric circuit, and especially to a fuse element for protecting the electric circuit by release in the case of excess temperature, the fuse element being adapted to be disposed on a circuit board of the electric circuit.

BACKGROUND OF THE INVENTION

In general, electric fuse elements are used in electric and/or electronic circuits in various configurations for the protection of the circuitry against overcurrent and/or especially against inadmissible heating. When the respective trigger conditions occur in connection with overcurrent or excess temperature, the fuse element is triggered and a particular electric circuit within a system and specifically within the circuit is disconnected or interrupted.

Such fuse elements are generally arranged on a circuit board of the electric or electronic circuit, wherein parts of the fuse element bridge particular points of an electric circuit within the circuitry and in the event of triggering interrupt the electric circuit at such point. For use in electric or electronic circuits fuse elements are manufactured as discrete component parts in large quantities in various configurations and sizes, wherein, depending on the configuration of the fuse elements, the latter can be arranged and mounted manually or by means of an automated operation on a respective circuit board.

Fuse elements that trip with respect to an excess temperature are configured, for example, so that upon reaching a defined excess temperature they open the respective electric circuit, wherein the excess temperature may be reached, on the one hand, by increased electric current and, on the other hand, by heat from outside or by a combination of both possibilities. Fuse elements for thermal triggering include for example in the interior a conductor element which upon excessive current intensity such as an event of short-circuit may entail triggering by designing the conductor element as a fusible conductor. By the great current heat occurring due to the excessive current and/or with excessive head supplied from outside the material of the conductor element fuses at a particular point thus causing the electric circuit to be interrupted. In general, upon reaching the trigger condition and upon triggering of the fuse element, i.e. after fusing of the conductor element, in the case of excessive current and interruption of the electric circuit the component part as such is destroyed.

Such known arrangement is illustrated in FIG. 8 in a simplified and schematic representation. The fuse element is provided in the form of a thermal fuse T including a fusible conductor S which fuses at a comparatively low temperature, is arranged between connecting wires A and is held by the latter. Said array is supported by fastening elements B which in turn are arranged on corresponding conductor paths L and are electrically connected to the conductor paths L. The gap between the conductor paths L shown in FIG. 8 is thus bridged by the thermal fuse T so that a corresponding electric circuit is closed by the thermal fuse T. The entire array is provided on a circuit board P made from insulating material.

In the case of excessive current intensity by the thermal fuse T the fusible conductor S is heated and fuses so that in the area of an interruption point U the electric circuit is interrupted. The electric circuit can be closed again only by replacement of the component part.

Document DE 20 2012 000 571 U1 illustrates a similar fuse element for thermal triggering. In a sealed casing a fusible conductor adapted to a predetermined current intensity which fuses upon reaching the current intensity and interrupts the electric circuit is located on electrically conductive posts or supports. The fused material of the fusible conductor is collected inside the casing. The entire fuse element can be handled with the casing and appropriate terminal contacts as a discrete component part and can be arranged on a circuit board by a mounting operation.

Document DE 196 39 427 A1 illustrates a component part in the form of a resistor in connection with a thermal fuse, with the thermal fuse being in the form of a bridge which bridges two conductor path ends in the area of a gap between the conductor paths.

FIG. 9 illustrates such arrangement of a known fuse element, wherein the conductor path ends L opposing each other via a gap are shown on a circuit board P. Both ends of the bridge-shaped element E are soldered on the respective conductor path end with a low-fusing solder and thus are mechanically and electrically connected to the conductor path ends L and the circuit board P. The bridge-shaped element E takes such shape that in the fastened (soldered) state upon connection of the two conductor path ends L mechanical stress occurs inside the element E according to which mechanical stress at least one side of the bridge-shaped element E can be lifted.

When either of the ends of the bridge-shaped element E soldered with solder fusing at low temperature is released by the solder fusing by heat acting thereon and thus at least one end of the bridge-shaped element E cannot be retained any longer, the respective end of the bridge-shaped element E detaches from the fused soldering point and adopts the position indicated by broken lines in FIG. 9 which corresponds to the trigger position at which the electric circuit is interrupted. In this case, too, the fuse element is destroyed upon occurrence of the trigger conditions and has to be replaced, where necessary.

Document U.S. Pat. No. 5,612,662 illustrates a thermal fuse in combination with a sheet metal strip to which elastic bias is imparted especially by the material selected and the corresponding shape. Both ends of the sheet metal strip are soldered. When the trigger condition is given and fusion of the soldered point is reached due to excessive heating, the element closing the electric circuit is deformed by the elastic bias and the electric circuit is opened. Accordingly, at least one of the two soldering points of the sheet metal strip is fused.

Document DE 196 47 035 A1 discloses a fuse device for protecting an electronic circuit, where equally a sheet metal strip is used as an aid for triggering the fuse device. The sheet metal strip itself does not constitute the fuse element but merely serves as a spring unit being appropriately biased so as to remove further component parts from the circuit board or at least turn them to one side after the respective trigger condition is given. The elastic force of the spring unit is applied to particular component parts, and when the trigger condition such as an excess temperature occurs, a certain number of soldering points of the respective component part is fused so that the retaining force for said component part is significantly reduced and the elastic spring force either removes the component part from the circuit board or at least turns the same to the side. In this way, an electric contact is disconnected. The spring unit is made from said sheet metal strip which is arranged at one side by form fit within an opening in the circuit board.

Finally, the document DE 10 2005 014 601 A1 relates to an electronic subassembly in which a fuse element is provided in combination with spring forces. Apart from given fuse devices in which a metal bracket being biased by a coil spring and bridging conductor paths can be lifted upon fusing one of the soldering points so as to interrupt the electric circuit, further alternatives made from elastic material and taking a specific shape are described. Accordingly, an elastic bracket having plural bends is provided which connects respective conductor paths isolated by a gap and for this purpose is soldered to the conductor paths. On one side, the bracket may engage in an opening of the circuit board by means of a projection. In particular, the contact bracket is fastened and soldered in an original shape on the circuit board and is then brought, by pressure, into a final shape exerting elastic force upon at least one of the soldering points. When the respective soldering point is fused due to excess temperature, then the electric circuit is interrupted by the elastic force lifting the contact bracket and removing the same from the soldering point.

The afore-described known arrangement of a thermal fuse including a specifically shaped contact bracket requires both sides of the contact bracket to be fixed by soldering for fastening the contact bracket so that the latter, on the one hand, can bridge both conductor paths to be connected safely and with certain ampacity and, on the other hand, is fastened at least on one side after triggering. Furthermore, it cannot be ensured whether after plastic deformation in the mounted state the residual elastic deformability and thus the remaining elastic force is safely sufficient to safely disconnect the electric circuit in the case of excess temperature and in the presence of the trigger criterion. In this context it is difficult, on the one hand, to define with certainty a remaining elastic force in connection with the plastic deformation and to realize the same with the component part and, on the other hand, to ensure a constant elastic force of predetermined strength over a quite long service life. Rather, after carrying out the plastic deformation significant tolerances and variations of force have to be expected as regards the remaining elastic force.

SUMMARY OF THE INVENTION

As compared to this, the object underlying the present invention is to configure a fuse element of the type described in the beginning such that, on the one hand, simplified assembly with reliable fastening of the fuse element is guaranteed and, on the other hand, sufficient elastic force can be exactly adjusted even for a rather long useful life.

The present invention relates to a fuse element for an electric circuit, wherein the fuse element can be applied to a circuit board of the electric circuit, comprising: a surface area for fastening and establishing electric contacts of the fuse element on the circuit board, a first deforming area adjacent to the surface area, a second deforming area connected to the first deforming area via a central area, and wherein the second deforming area has a contact area by which the fuse element abuts on the circuit board, and a hook-shaped element which is formed on the second deforming area and is insertable into an opening in the circuit board arranged adjacent to the contact area of the second deforming area, wherein the hook-shaped element is insertable into the opening of the circuit board by elastic deformation of the fuse element in the direction of the circuit board, and after insertion of the hook-shaped element into the opening and positive retaining of the hook-shaped element on a lower surface of the circuit board adjacent to the opening the first and second deforming areas exert elastic force upon the surface area and thus upon a soldering area between the surface area and the conductor paths to be connected.

It is achieved by the structure and the functioning of the fuse element according to the invention that with the presence of the trigger criterion in combination with an excess temperature or over-temperature the fuse element adapted to be arranged on a circuit board is reliably triggered for interrupting a defined electric circuit. Thus, when a soldered area is fused in the surface area of the fuse element due to the excess temperature (irrespective of the source of heat), then the predetermined elastic force acting on the surface area can lift the latter off the soldering area and, resp., the soldering points and thus from the bridged conductor paths so that safe disconnection of the electric circuit is ensured after the trigger condition is given.

After completing the fuse element in the original and not elastically deformed configuration, no further plastic deformations are required any more. Rather, by means of simple manufacturing operations the finished fuse element can be soldered onto the conductor paths (and thus on one side), and for providing the required elastic force on the surface area by means of low pressure onto the central area of the fuse element the hook-shaped element can be achieved to safely and positively engage in the opening of the circuit board. Plastic deformations are neither required any more nor are they desired, and all of the deformations to be carried out after completion are carried out exclusively in the elastic area so that an undesired and detrimental change of the characteristics of the fuse element by inadvertent plastic deformation can be exactly dimensioned with respect to the elastic force to be exerted upon the surface area and is not falsified by possible plastic deformations with significant tolerances.

The elastic force exerted upon the surface area after mounting the fuse element according to the present invention is generated by the entire structure of the fuse element but primarily by the first and second deforming areas in that the elastic deformation can be specifically brought about without any transition to a plastic deformation by low pressure from outside onto the central area for mounting the fuse element on the circuit board. At the same time, the hook-shaped element is caused to engage in the opening within the circuit board which is located adjacent to the contact area. After engagement of the hook-shaped element, at this point a positive connection of the fuse element to the circuit board is given. When the surface area of the fuse element is lifted off due to the elastic force when the function of the fuse element is exerted upon reaching the trigger criterion, then the fuse element continues being connected and fastened to the circuit board due to the positive connection of the collar-shaped element, while the connection between the conductor paths is disconnected safely, efficiently and non-reversibly.

The arrangement according to the invention thus, on the one hand, guarantees the desired easy manufacture of the fuse element in the complete, undeformed or non-deformed and original state as well as subsequent simple mounting without any further plastic deformations being required, and moreover guarantees safe functioning with a defined or predeterminable elastic force on the surface area as well as an approximately constant force transmission during longer useful life or service life, as the deformations occurring after manufacture and during mounting on the circuit board are located merely within the elastic area. Thus, the fuse element according to the invention allows to achieve reliable triggering when the trigger criterion or criteria is/are present.

Further advantageous embodiments of the invention shall be described in the following.

With the fuse element the second deforming area may include two juxtaposed strip-shaped parts being spaced apart from each other and the intermediate area between the strip-shaped parts may be cut free and bent outwards to form the hook-shaped element.

With the fuse element the hook-shaped end of the hook-shaped element may be located adjacent to the contact area in the state before mounting the fuse element on the circuit board and after insertion into the opening of the circuit board it may abut below the contact area and positively on a lower surface of the circuit board.

After insertion of the hook-shaped element into the opening of the circuit board and positive abutment of the hook-shaped end on the lower surface of the circuit board, an elastic clamping force is formed between the contact area and the hook-shaped element with the circuit board being located therebetween.

The fuse element may be formed integrally of strip-shaped metallic material and the surface area and the contact area may be formed in parallel to an upper surface of the circuit board.

The surface area of the fuse element may be configured to connect conductor paths of an electric circuit separated after a corresponding soldering operation to each other and thus to establish contacts with the same.

The first deforming area may include a first lateral area connecting the first deforming area to the central area, and wherein, before insertion of the hook-shaped element into the opening in the circuit board, the direction of extension of the first lateral area may extend across the center between the conductor paths to be connected on the circuit board.

The surface area may include long lateral areas in its direction of extension and the long lateral areas may be folded upwards in the direction of the first lateral area.

The first lateral area may be perpendicular to the surface area and a surface of the circuit board in the state prior to insertion of the hook-shaped element into the opening in the circuit board.

BRIEF DESCRIPTION OF THE DRAWINGS

Hereinafter, the present invention shall be described by way of example embodiments with reference to the drawing, wherein:

FIG. 8 shows a simplified and schematic representation of a known thermal fuse having a fusible conductor on a circuit board, and FIG. 9 shows a known arrangement of a thermal fuse having a spring element in the non-triggered state and, as compared to this, in the indicated triggered state.

DETAILED DESCRIPTION

Example Embodiment

Figure 3A:
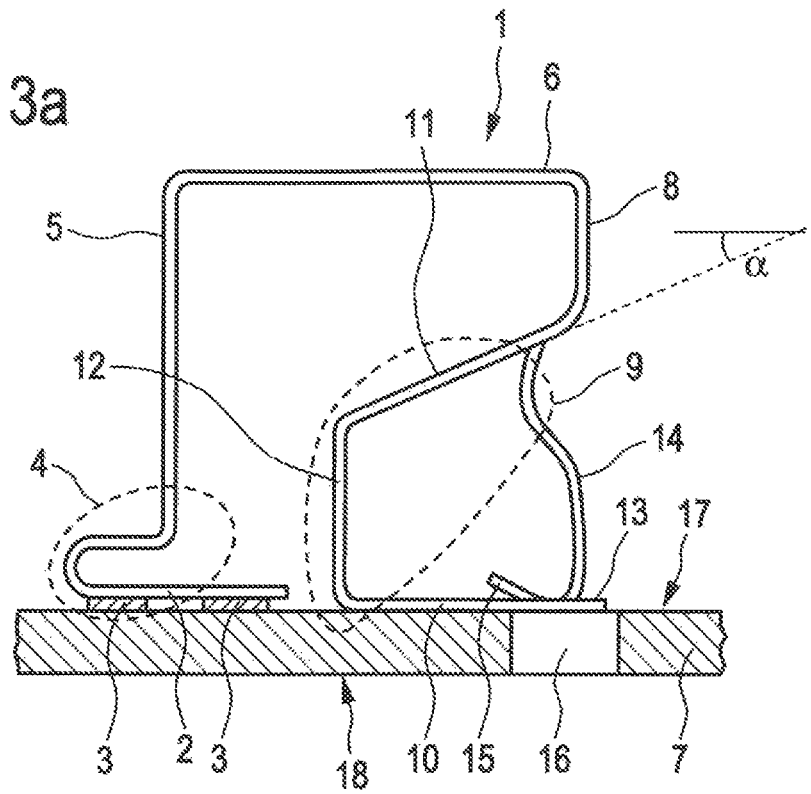
FIG. 3a shows a lateral view of the fuse element in the non-deformed state and of the positioning on the circuit board prior to mounting.
Figure 3B:
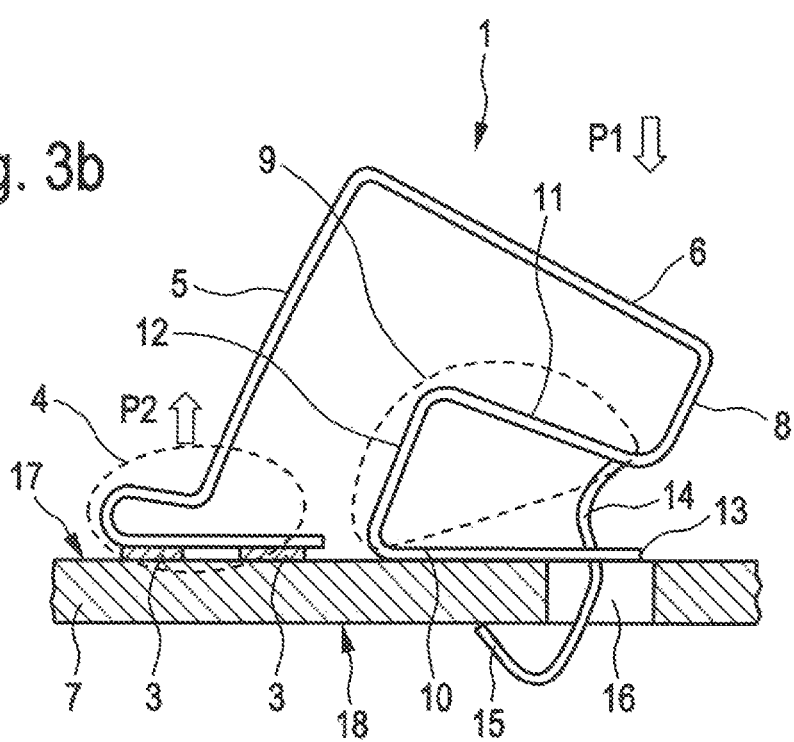
FIG. 3b shows a lateral view of the fuse element in the deformed state after mounting on the circuit board.
Figure 4:
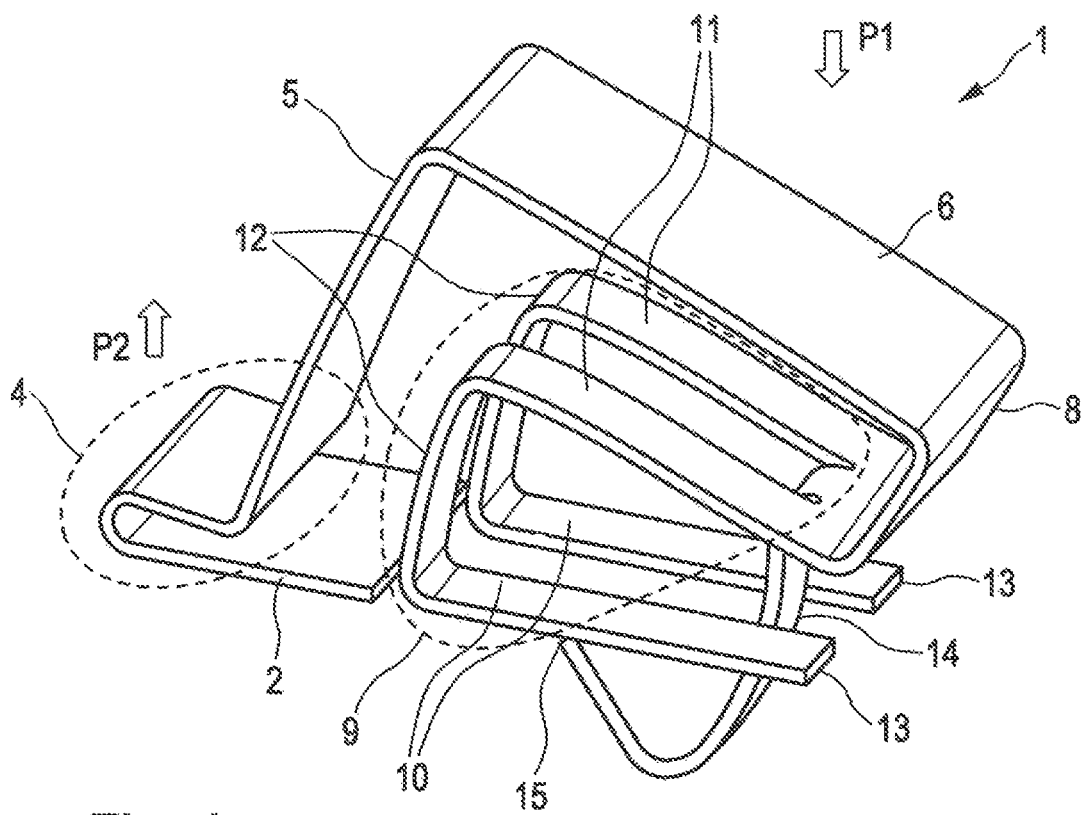
FIG. 4 shows a perspective view of the fuse element in the deformed state after arrangement on the circuit board without representation of the circuit board.

The basic structure of the fuse element according to the present invention shall be described hereinafter in connection with the representations in FIGS. 1 and 2 by way of an example embodiment. The further FIGS. 3a, 3b and 4 illustrate the arrangement of the fuse element prior to and after mounting on a circuit board 7 according to a deformed and thus operative state. The fuse element 1 thus can be disposed on the circuit board 7.

Figure 1:
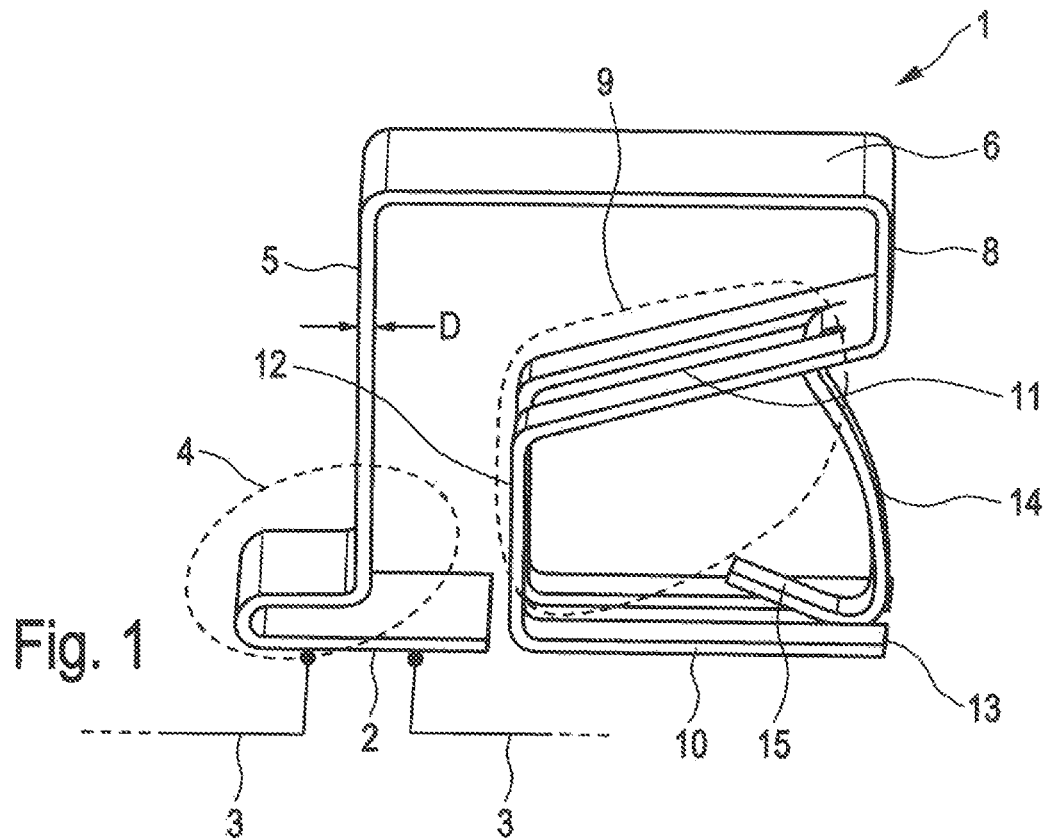
FIG. 1 shows a perspective lateral view of the fuse element in the finished state prior to arrangement on a circuit board.
Figure 2:
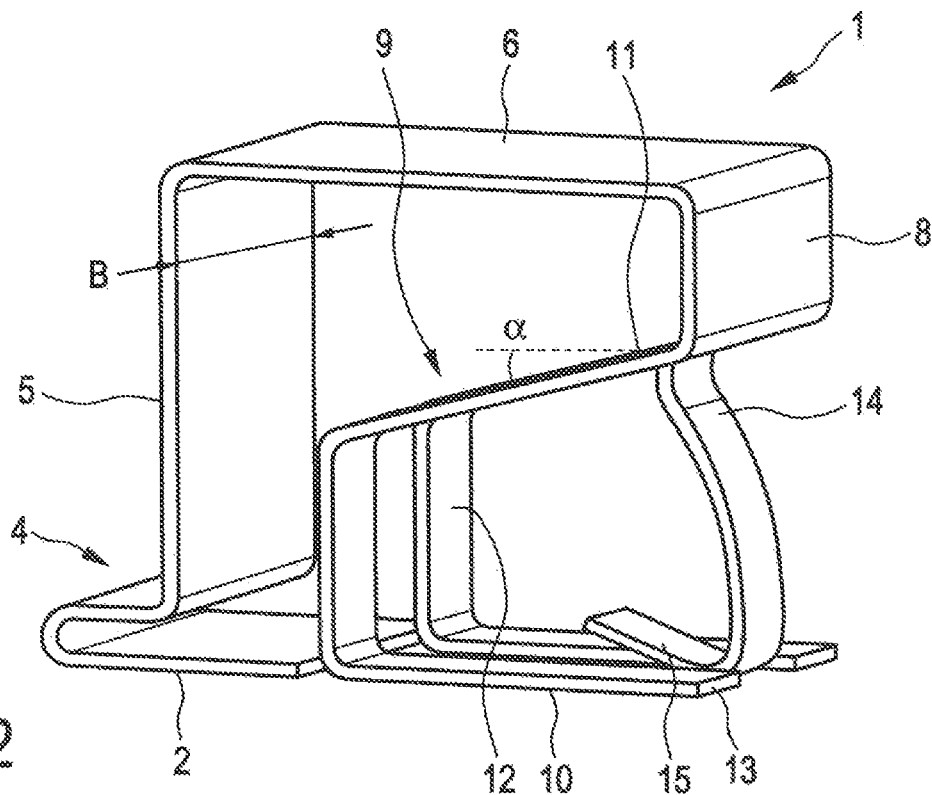
FIG. 2 shows a perspective view from a viewing angle similar to that of FIG. 1 in the non-deformed state prior to arrangement on the circuit board.

According to the representation in FIGS. 1 and 2, preferably the fuse element 1 is formed integrally of a strip of a metallic and especially a solderable material. The material offers the possibility of plastic deformation and further also has sufficient elasticity. The fuse element 1 in the form shown in FIGS. 1 and 2 can be manufactured to the full extent and thus completely by means of appropriate machines. The shape of the fuse element 1 shown in FIGS. 1 and 2 is the shape achieved after complete manufacture or pre-fabrication and, resp., original shape which, except for the measures for manufacture, for itself requires no further plastic deformation for achieving the operating state. The configuration according to FIGS. 1 and 2 is referred to as the undeformed or non-deformed state of the fuse element 1.

The strip of the metallic material of the fuse element 1 has the width B as shown in FIG. 2. The strip further has the thickness D as shown in FIG. 1. The width B and the thickness D can be variable along the course or the extension of the fuse element 1. Preferably, the width B and the thickness D are equal along the extension of the fuse element 1 except for respective inevitable tolerances.

The fuse element 1 according to FIGS. 1 and 2 at one end comprises an area which is substantially flat with respect to possible tolerances and which shall hereinafter be referred to as surface area 2. The surface area 2 has a flat shape, wherein soldering with corresponding conductor paths 3 disposed on the circuit board 7 is ensured by the lower side of the surface area 2 shown in FIGS. 1 and 2 which during mounting is opposed to the circuit board 7. The approximate position of the conductor paths 3 relative to the surface area 2 is shown schematically and in a simplified manner in FIG. 1 for the purpose of illustration. Below the surface area 2 a soldering area is formed in which the conductor paths are soldered.

The conductor paths 3 are conductor paths arranged to be mechanically separated from each other and electrically insulated from each other or specific ends thereof and constitute parts of an electric circuit to be protected.

Between the conductor paths or conductor path ends below the surface area 2 a gap for galvanic isolation of the two conductor paths 3 is provided which is bridged by the surface area 2 of the fuse element 1 and especially by the soldering area after soldering. The soldering area thus has at least two individual soldering points by which the respective conductor path 3 or the respective conductor path end is soldered with the surface area 2 arranged there-above.

The object of the fuse element 1 to disconnect or interrupt a respective electric circuit in the case of occurrence of a release criterion to be described hereinafter causes the disconnection at said point by removing the connection between the conductor paths 3 formed by the surface area 2. In so doing, at least one of the soldering points or the entire soldering area is fused.

The fuse element 1 further comprises, according to the corresponding representations in FIGS. 1 and 2, a first bending area or deforming area 4 which in FIG. 1 is surrounded by a broken line and in which in combination with the elasticity of the material of the fuse element 1 a predetermined elastic deformation or bending is possible. The first deforming area 4 is connected to the surface area 2 in the course of the arrangement of the fuse element 1 and comprises two pre-fabricated bends having especially respective contrary or opposite bending directions. The respective opposite bending directions of the first deforming area 4 thus show an approximate S shape.

The first deforming area 4 includes, as transitional area or transitional portion, a first lateral area 5 extending substantially perpendicularly relative to the surface area 2, with a bridge-shaped central area 6 being in turn connected to said lateral area and extending substantially in the same direction as the surface area 2 and thus extending (with consideration of tolerances) approximately along the surface area 2 and hence along and, resp., in parallel to the circuit board 7 to which the fuse element 1 can be attached. Thus, the first lateral area 5 also extends approximately perpendicularly to the circuit board 7 and, resp., to the upper surface thereof.

A plastic bending or deformation between the first lateral area 5 and the central area 6 during manufacture of the fuse element 1 approximately forms a right angle in the completely pre-fabricated and force-free (i.e. undeformed) state.

A second lateral area 8 which equally forms an approximately right angle relative to the central area is connected to the central area 6. The first lateral area 5, the central area 6 and the second lateral area 8 thus constitute a bridge-shaped or stirrup-shaped portion of the fuse element 1.

In the course of expansion of the fuse element 1, a second deforming area or bending area 9 is connected to the second lateral area 8. The second deforming area 9 is denoted in FIG. 1 just as the first deforming area 4 by a broken line.

The second deforming area 9 extends from the second lateral area 8 and, resp., the lower end thereof shown in FIGS. 1 and 2 approximately U-shaped, when viewed from the side, wherein according to the illustrations in FIGS. 1 and 2 (and equally in the further FIGS. 3a, 3b and 4 described hereinafter) the lower leg of the U-shaped arrangement has a flat design and after mounting rests on the surface 17 of the circuit board 7 when arranged in parallel to an upper surface 17 of the circuit board 7. The leg of the U-shaped arrangement of the second deforming area 9 is referred to as contact area, as said portion of the fuse element 1 abuts substantially flatly on the circuit board 7 and, resp., the upper surface 17 thereof both before insertion of the fuse element 1 onto the circuit board 7 and after insertion or mounting of the fuse element 1 on the circuit board 7.

The parts of the fuse element 1 according to the second deforming area 9 of U-shaped arrangement (cf. FIGS. 1 and 2) comprise an upper leg 11 which is connected directly to the second lateral area 8 (and, resp., the lower end shown in FIGS. 1 and 2) and is bent to a predetermined extent relative to the second lateral area 8 so that the arrangement of the upper leg 11 in the representation in FIGS. 1 and 2 is slanted downwards corresponding to a predetermined angle α within an angular range of from about 10° to 30° relative to an imaginary horizontal line. The present invention is not restricted to said exemplary angular range. The imaginary horizontal line is the extension or the orientation of the circuit board 7 or of the contact area 10 or of the central area 6, for example.

The contact area 10 forming a lower leg in connection with the second deforming area 9 is connected to the upper leg 11 via a central leg 12, the central leg 12 and the contact area 10 approximately forming a right angle in the original and non-deformed configuration of the fuse element 1 (FIGS. 1, 2 and 3a). By this arrangement, this part of the fuse element 1 can be elastically deformed in the second deforming area 9 and in combination with the elastic properties of the material of the fuse element 1. This shall be described in detail hereinafter.

The second deforming area 9 including the upper leg 11, the central leg 12 and the contact area 10 is configured such that with respect to the width B of the strip-shaped material of the fuse element 1 a central area has been cut free so that in the portion of the fuse element 1 between the lower end of the second lateral area 8 and an outer end 13 of the contact area 10 the respective components of the fuse element 1 (upper leg 11, central leg 12 and contact area 10, cf. FIGS. 1 and 2) are in the form of two strips guided in parallel with a gap disposed therebetween. The central portion which has been cut free from the portion of the second deforming area 9 continues being connected, according to FIGS. 1 and 2, by its upper end to the transition between the second lateral area 8 and the upper leg 11 and within the scope of manufacture of the fuse element 1 is plastically shaped in such manner that a hook-shaped element 14 is formed. The hook-shaped element 14 thus extends from the lower end of the second lateral area 8 toward the outer end 13 of the contact area 10 and is formed adjacent to the contact area 10 between the strip-shaped portions of the contact area 10 with an upwardly directed hook-shaped end 15. In the completely pre-fabricated state according to FIGS. 1 and 2, the hook-shaped end 15 of the hook-shaped element 14 thus ends between the strip-shaped portions of the contact area 10 adjacent to the conductor plate 7.

Irrespective of the division of the second deforming area 9 into individual strip-shaped elements and by partially cutting free the strip-shaped part of the hook-shaped element 14, the fuse element 1 in its entirety is configured in one piece, i.e. the hook-shaped element 14 is connected, by its upper end illustrated in FIGS. 1 and 2, to the second deforming area 9 and, resp., to the lower end thereof shown in FIGS. 1 and 2. The proportionate strip of the hook-shaped element 14 thus is not completely cut out of the fuse element 1 but continues being connected to the further parts of the fuse element and being part thereof. The hook-shaped element 14 is thus bent out of the second deforming area 9.

By partially cutting free the strip-shaped part of the hook-shaped element 14, between the strip-shaped parts of the second deforming area 9 a space approximately corresponding to the width of the cut-free strip-shaped part of the hook-shaped element 14 is formed. The individual strip-shaped parts of the second deforming area 9 and of the hook-shaped element 14 may have different widths, with an approximately equal width of the respective strip-shaped parts being preferred, however.

The hook-shaped element 14 and especially the dedicated hook-shaped end 15 thus ends, in the undeformed and originally manufactured state of the fuse element 1, in the vicinity of the outer end 13 of the contact area 10 and especially between the respective strip-shaped parts of the contact area 10 (FIGS. 1, 2 and 3a). The hook-shaped end 15 may slightly contact the circuit board 7 or may end at a small distance from the surface of the circuit board 7 (FIG. 3a).

In the following, in connection with FIGS. 3a and 3b the use of the fuse element 1 as thermal fuse is illustrated, wherein FIG. 3a shows the arrangement of the fuse element 1 in the original and non-deformed state on the circuit board 7 prior to mounting (i.e. prior to insertion into the circuit board 7 being described hereinafter), whereas FIG. 3b shows the arrangement of the fuse element 1 in an elastically deformed state after mounting or insertion of the fuse element 1 onto the circuit board 7.

According to FIG. 3a, the fuse element 1 is shown in the originally manufactured shape and in the non-deformed state, with the fuse element 1 being positioned on the circuit board 7 for subsequent assembly. The surface area 2 according to the representation in the Figures in the left part of the fuse element 1 contacts the conductor paths 3 to be bridged in each case, and in the surface area 2 the soldering area is soldered with the individual conductor paths 3 and, resp., the ends thereof. The soldered connection is not shown in detail for simplifying the illustration. A solder is used in this case which fuses at a relatively low temperature. The fusing temperature depends on the configuration of the trigger criterion defining at which temperature the thermal fuse formed on the basis of the fuse element 1 is intended to open. The type and size of the soldering area and, resp., of the soldering points as well as of the surface area 2 and of the thickness D of the material of the fuse element 1 are further determined in response to a desired ampacity (via the conductor paths 3, the soldering points and the surface area 2) in the real use of the circuitry in which the fuse element 1 is utilized.

The contact area 10 of the fuse element 1 equally contacts the surface of the circuit board 7 and rests substantially (i.e. with consideration of appropriate inevitable tolerances) flatly on the surface of the circuit board 7. Thus, the surface area 2 and the contact area 10 are arranged in parallel to the circuit board 7.

As is shown in FIGS. 3a and 3b, the circuit board 7 includes an opening 16 in its respective portion in the contact area 10 of the fuse element 1 and especially according to the illustration in FIGS. 3a and 3b beneath the hook-shaped element 14. The opening 16 extending through the thickness of the circuit board 7 has such width that the hook-shaped element 14 and especially the hook-shaped end 15 thereof can be easily (with slight elastic deformation of the hook-shaped element 14, where necessary) passed through the opening 16. The hook-shaped end 15 of the hook-shaped element 14 thus can be passed through the opening 16 while the fuse element 1 is appropriately deformed and in connection with the opening 16 can engage below the contact area 10 of the fuse element 1. As a result, the fuse element 1 rests on the upper surface 17 of the circuit board 7 with the contact area 10, and the hook-shaped end 15 contacts a lower surface 18 of the circuit board 7 in FIG. 3b beneath the contact area 10 adjacent to the opening 16 in the circuit board 7 for forming the positive connection.

This situation is illustrated in FIG. 3b. By means of a first arrow P1 a force temporarily exerted on the fuse element 1 during assembly is illustrated by which force the fuse element 1 is brought from the non-deformed state shown in FIG. 3a into an elastically deformed state according to the illustration in FIG. 3b. The force is exerted primarily on the central area 6 of the fuse element 1 so that a bending or deformation will occur in the first deforming area 4 and in the second deforming area 9 and, according to the illustration in FIG. 3b, the right-hand portion of the fuse element 1 performs a movement substantially in the direction of the circuit board 7. In particular, for example the second lateral area 8 moves substantially in the direction of the circuit board 7, with the hook-shaped element 14 the hook-shaped end 15 of which is located approximately above the opening 16 being passed through the opening 16.

When the hook-shaped end 15 of the hook-shaped element 14 reaches the lower end of the opening 16 shown in FIGS. 3a and 3b in the area of the lower surface 18 of the circuit board 7, then due to the appropriate elastic bias the hook-shaped element 14 will perform a slight movement toward the second deforming area 9 in the lateral direction and especially in the direction of the second deforming area 9 (i.e. in FIG. 3b to the left in the image plane) so that the hook-shaped end 15 safely abuts on the lower surface 18 of the circuit board 7 and in this way forms a positive connection. Said lateral movement of the hook-shaped element 14 extends to the left in the direction of the image plane with respect to the illustration in FIGS. 3a and 3b.

When the force indicated by the first arrow P1 is cancelled, then the fuse element 1 remains in the elastically deformed state according to FIG. 3b, and the hook-shaped end 15 of the hook-shaped element 14 contacts the lower surface of the circuit board 7 so that the established positive connection is maintained. Due to the elastic bias of the hook-shaped element 14 toward the second deforming area 9 after insertion into the opening 16, the fuse element 1 cannot be automatically released from the deformed state according to FIG. 3b, but the fuse element 1 remains in the shown elastically deformed state and in the positive connection of the hook-shaped element 14 to the circuit board 7 via the opening 16.

By the elastically deformed state of the fuse element 1 shown in FIG. 3b both in the first deforming area 4 and in the second deforming area 9 an appropriate elastic deformation is given which in connection with the entire arrangement of the fuse element 1 exerts elastic force upon the surface area 2 that is directed away from the circuit board 7 and is illustrated by a second arrow P2 as direction of force or direction of the triggering force in FIG. 3b and FIG. 4.

When in the state of the fuse element 1 according to the illustration in FIG. 3b the trigger criterion occurs, i.e. when in the surface area 2, the soldering area and the conductor paths 3 the specified temperatures (irrespective of the source of the heat) occur at which the low-fusing solder will fuse, then the retaining force exerted on the surface area 2 and the soldering area by the soldered connection is cancelled, and the surface area 3 is moved in the direction of the second arrow P2 away from the circuit board 7 and the conductor paths 3 due to the triggering force. In this way, the connection between the separately arranged conductor paths 3 is opened so that an electric circuit connected thereto is equally opened or interrupted. Thus, with the presence of the trigger criterion the effect of the fuse element 1 as thermal fuse has occurred and the electric circuit has been efficiently and non-reversibly interrupted.

After triggering the fuse element 1 and interrupting the connection between the conductor paths 3 and, resp., lifting the surface area 2 off the conductor paths 3, the fuse element 1 remains in the triggered state and, due to the elastic forces, is held between the contact area 10 and the hook-shaped element 14 or the hook-shaped end 15 thereof. The fuse element 1 thus is safely held at the mounting position on the circuit board 7 due to the positive connection to the circuit board 7 even after triggering and interruption of the electric circuit.

For illustration of the state of the fuse element 1 according to the representation in FIG. 3b in the completely mounted and non-triggered operating state corresponding to the elastically deformed state, FIG. 4 shows the same state in a perspective view, wherein for the purpose of illustrating especially the position of the hook-shaped element 14 and the hook-shaped end 15 thereof relative to the second deforming area 9 the circuit board 7 is omitted. The respective elastic deformations are evident in each of the first and second deforming areas 4 and 9. It is equally evident that the hook-shaped end 15 of the hook-shaped element 14 clearly engages below the position or spatial position of the contact area 10. Specifically, the hook-shaped element 14 is located between the two strip-shaped parts of the contact area 10 and preferably in the middle between said parts so that forces are merely exerted substantially perpendicularly to the surface of the circuit board 7. Lateral forces for pivoting the fuse element 1 toward either side after triggering are largely excluded in the arrangement.

The clamping forces achieved between the contact area 10 of the fuse element 1 and the hook-shaped end 15 of the hook-shaped element 14 thus are approximately or about perpendicular to the circuit board 7. The clamping forces applied by the fuse element 1 by the shaping and the material result in a reliable hold also for the fuse element 1 on the circuit board 7 after triggering, when the retaining effect of the soldering area and, resp., the soldering points has been dropped and the fuse element 1 abuts on the circuit board 7 merely in the contact area 10.

In the non-deformed state according to FIG. 3a and after soldering in the soldering area, a material connection is provided between the fuse element 1 and the circuit board 7 at the soldering area or the soldering points, and according to FIG. 3b additionally a positive connection to the circuit board 7 is formed after elastic deformation (in the direction of arrow P1). The elastic force acting on the surface area 2, i.e. the triggering force according to arrow P2, is compensated by the retaining force of the soldering points between the surface area 2 and the conductor paths 3. As soon as the retaining force between the surface area 2 and the conductor paths 3 is neutralized by fusing the solder at the soldering area, the limited movement is performed by the elastic force or triggering force according to the second arrow P2.

In the deformed state of the fuse element 1 shown in FIGS. 3b and 4, a deformation is provided exclusively in the elastic area, whereas a further plastic deformation after completion of the fuse element 1 (FIGS. 1, 2, 3a) is neither performed nor strived for. On the one hand, it is not required and on the other hand it is undesired, as by further plastic deformation the accuracy of the adjustment of the triggering force as well as of the distribution of forces and deformation within the fuse element (i.e. along the extension of the fuse element) is reduced.

Elastic deforming or deflection of the components of the fuse element 1 and specifically of the first and second deforming areas 4 and 9 thus takes place merely in the elastic area of the material of the fuse element 1. The required plastic deformations in the fuse element 1 are merely measures in bringing about the basic state or initial state as shown, for example, in FIGS. 1, 2 and 3a (non-deformed state). Upon deflection of the fuse element 1 after application of the force according to the first arrow P1 in the direction of the circuit board 7, the fuse element 1 elastically moves and, resp., deforms in its entirety and adopts a corresponding deformation (only in the elastic area) such that upon obtaining the positive connection of the hook-shaped element 14 in the opening 16 the desired triggering force according to the second arrow P2 is safely achieved and held.

Due to the deformations or bends effectuated in the fuse element 1 in the elastic area, the desired triggering force in the direction shown according to the second arrow P2 can be set relatively accurately and with small tolerances as well as permanently and uniformly for a longer service life. This is further relating to easy assembly, as merely a two-part soldering point of the soldering area is formed by means of a soldering operation and subsequently the positive connection can be obtained by a simple movement in the elastic area. The arrangement of the fuse element 1 according to the afore-described Figures helps to easily obtain the positive connection, when the deforming force according to the first arrow P1 is exerted, without the deforming force being fully exactly aligned. The arrangement of the fuse element 1 ensures well-directed elastic deflection only in the required manner for establishing the positive connection via the opening 16 in the circuit board 7.

It is furthermore evident from FIG. 4, for example, that upon exertion of the deforming force over the entire extension of the fuse element 1 a deformation or bending occurs with the exception of the surface area 2 and the contact area 10. The largest extent of deformation occurs in the first and second deforming areas 4 and 9, but the further areas of the fuse element 1, such as the first and second lateral areas 5 and 8 as well as the central area 6, are involved in forming the elastic triggering force. In total, the triggering force which permanently acts on the surface area 2 after reaching the state shown in FIGS. 3b and 4 can be finely adjusted or dosed so that the soldering points in the surface area 2 with the conductor paths 3 are not mechanically overloaded even in the case of vibration load of the circuit board 7 in real use and will not inadvertently break. This would result in a loose contact between the surface area 2 and the conductor paths 3 or in a faulty complete interruption of the electric circuit.

Figure 5:
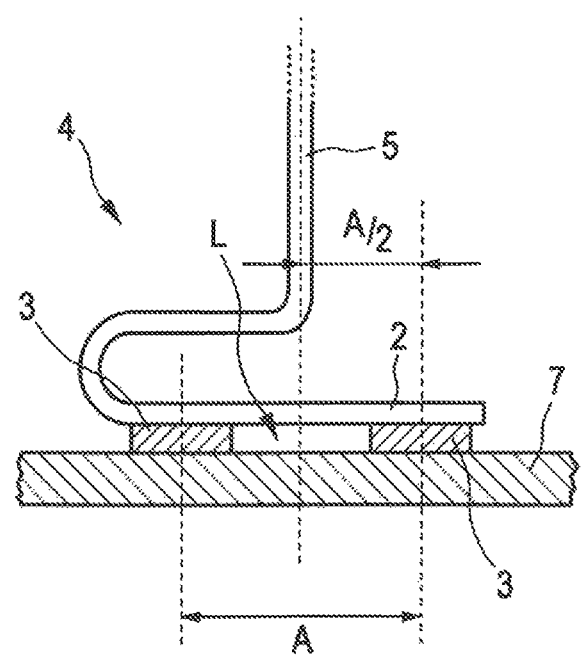
FIG. 5 shows the arrangement of the surface area and of the first lateral area relative to the contacting conductor paths.

FIG. 5 illustrates an arrangement of the surface area 2 and of the first lateral area 5 relative to the conductor paths 3 disposed on the circuit board 7. In the arrangement shown in FIG. 5 the first lateral area 5, on the one hand, extends substantially perpendicularly to the direction of extension of the surface area 2 and to the circuit board 7 and, on the other hand, the position of the first lateral area 5 is located in the middle between the conductor paths 3 in a gap L. At the gap L the conductor paths 3 have a distance A from each other, when viewed from the middle of the one conductor path to the middle of the other conductor path. The extension of the first lateral area 5 thus is located at A/2 of the distance A so that the arrangement of the first lateral area 5 is substantially symmetrical to the arrangement of the conductor paths 3.

In this way, the magnitude of shear forces at the soldering area and, resp., the soldering points with the conductor paths 3 is considerably reduced or the shear forces still occurring in such case are negligible and, resp., do not result in an undesired strain of the soldering area. This arrangement and the reduction of the possible shear forces acting on the soldering points help to achieve an increased service life of the soldering area, especially when using the fuse element 1 on a circuit board in the automotive field or in general in machines and devices subjected to strong vibrations and temperature variations. Thus, undesired break of one of the soldering points of the soldering area can be almost excluded. Accordingly, the service life is advantageously extended in combination with safe operation of the fuse element.

Alternative Embodiment

In the following, in connection with FIGS. 6 and 7 another example embodiment with an alternative configuration of the fuse element 1 is described.

Figure 6:
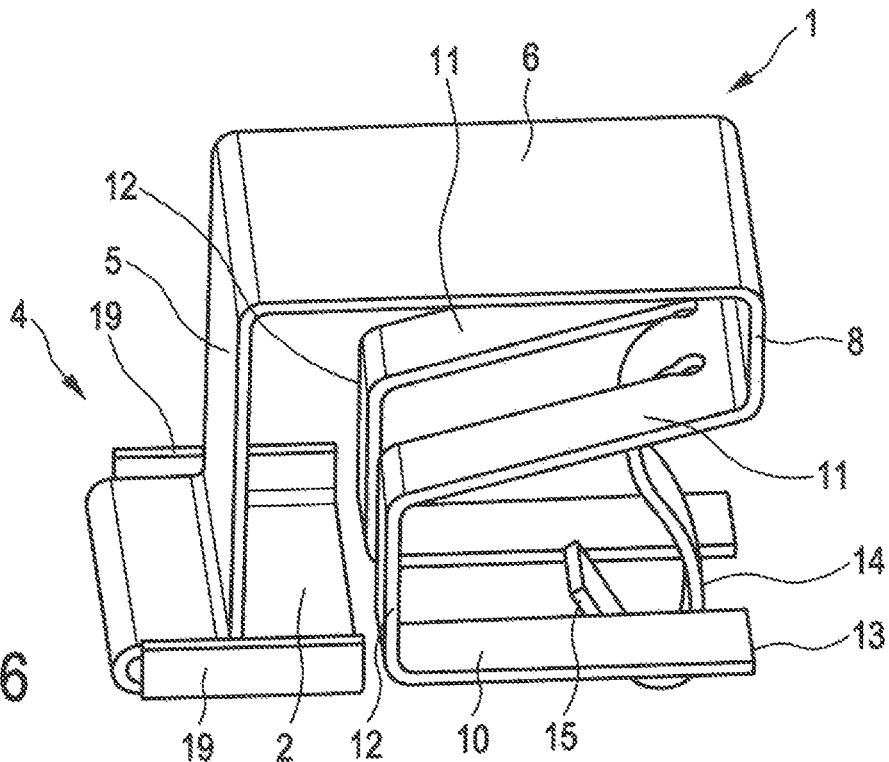
FIG. 6 shows an alternative embodiment of the fuse element having a modified surface area.
Figure 7:
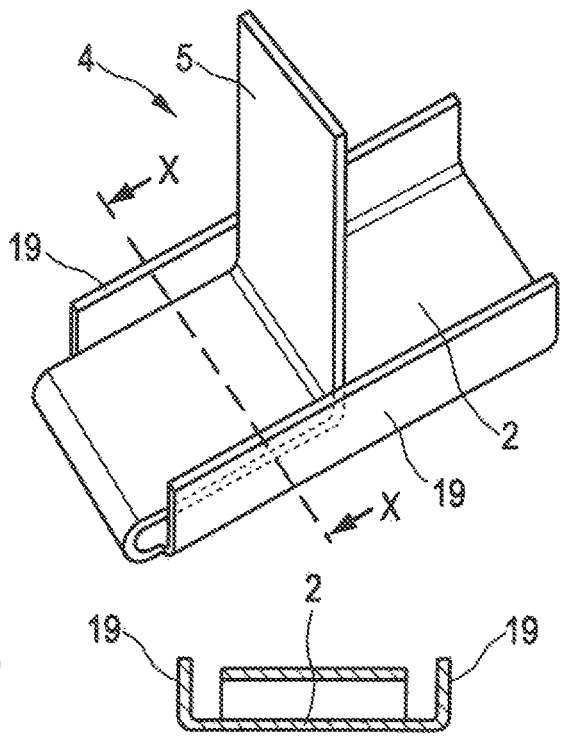
FIG. 7 shows an enlarged view of the surface area including the lateral areas folded upwards as well as a sectional view.

FIGS. 6 and 7 specifically show an alternative configuration of the surface area 2 from the preceding Figures. As compared to the configuration of the surface area 2 as a flat surface according to the first embodiment as described before in connection with e.g. FIGS. 1 to 5, in the configuration shown in FIG. 6 long lateral areas 19 of the surface area 2 are more strongly formed and, according to the illustration in FIG. 6, are folded upwards in the direction of the first lateral area 5 so that a bending edge is formed at the longer lateral areas.

The long lateral areas 19 extending in the direction of the longitudinal extension are thus upwardly inclined after bending or folding upwards or are preferably perpendicular or approximately perpendicular to the remaining, still flat surface of the surface area 2. For this purpose, in the surface area 2 the width B of the strip-shaped material of the fuse element 1 during manufacture is designed to be larger than in the further extension of the fuse element 1, for example in the first lateral area 5. The width B of the strip-shaped material of the fuse element 1 is selected such that the long lateral areas 19 extend upwards after being folded upwards in FIGS. 6 and 7 and end, for example, at the first deforming area 4 or the lower part of the first lateral area 5 (FIGS. 6 and 7).

The further configuration of the surface area 2 and specifically the arrangement of the soldering area between the surface area 2 and the conductor paths 3 to be connected of the respective circuitry corresponds to the arrangement according to FIGS. 1 to 5. The lower surface of the surface area 2 shown in FIGS. 6 and 7 for soldering with the conductor paths remains a flat surface, irrespective of folding the long lateral areas 19 upwards, for forming the soldering area and for introducing forces to the conductor paths 3 after the soldering operation.

FIG. 7 shows a perspective view of the alternative configuration of the surface area 2, and further illustrates a sectional view corresponding to the sectional line X-X. In FIGS. 6 and 7, for simplifying the representation the circuit board 7 and the conductor paths 3 are omitted. The further design of the fuse element 1 corresponds to the design described before in connection with FIGS. 1 to 5.

According to the representation in FIGS. 1 to 3, after complete manufacture and in the undeformed state of the fuse element 1 the lower end of the hook-shaped element 14 is located approximately in the area of the outer ends 13 of the contact area 10 and specifically between the strip-shaped portions of the contact area 10 with the upwardly directed hook-shaped end 15. The lower end of the hook-shaped elements 14 thus can contact the circuit board in the undeformed state.

In contrast to this, FIG. 6 alternatively shows the arrangement in which in the undeformed state of the fuse element 1 the lower end of the hook-shaped element 14 is arranged between the strip-shaped portions of the contact area 10 more deeply, however, so that e.g. the hook-shaped end 15 is approximately adjacent to the strip-shaped portions of the contact area 10. When the fuse element 1 is positioned in the undeformed state on the circuit board 7 for mounting, then the lower end of the hook-shaped element 14 already protrudes into the opening 16 in the circuit board (cf. FIGS. 3a and 3b) without engaging in the manner shown in FIG. 3b, however.

In this way, facilitated positioning of the fuse element 1 on the circuit board 7 can be achieved, as a certain elastic guiding of the fuse element 1 occurs during positioning in connection with the opening 16 in the circuit board 7. Engagement of the fuse element 1 on the circuit board, i.e. complete insertion of the hook-shaped element 14 into the opening 16 of the circuit board 7 in the manner shown in FIG. 3b for forming the positive connection, is achieved by the force temporarily acting in the direction of the first arrow P1 according to FIG. 3b. The hook-shaped element 14 according to the arrangement in FIG. 6 is adjacent, after insertion into the opening 16 of the circuit board 7, below the contact area 10 and positively to the lower surface 18 of the circuit board 7, wherein equally merely deformations of the fuse element 1 are provided in the elastic area.

By the afore-described configuration of the surface area 2 in which in connection with FIGS. 6 and 7 the long lateral areas 19 are bent or folded upwards, apart from the advantages already afore-described and afore-achieved in connection with FIGS. 1 to 5, further advantages are achieved in such manner that in the entire surface area 2 an enlarged strength (dimensional stability and stability, resistance to bending) is given which furthermore results in more uniform and thus improved force distribution and force application to the soldering area and, resp., the soldering points and, hence, also to the conductor paths 3. In this way, the soldering points of the soldering area are loaded to a lower extent and also and more uniformly so that the service life is further improved and the safe operation is maintained. Breaks of the soldering points or at least of one soldering point are almost excluded.

As regards dimensioning of the strip-shaped material of the fuse element 1, the thickness of the strip-shaped material may be selected to be about 0.1 mm to 0.3 mm, advantageously about 0.2 mm. The width B according to the representation in FIG. 1 amounts to about 3 mm to 5 mm. In the case of higher currents to be expected through the conductor paths 3, the dimensions may as well be selected to be larger by the factor 2 to 5 and in the case of lower currents they can be selected to be smaller.

The material may be a standard stamping material such as CuSn6. If lower electric resistances are intended to be useful, also further conductive materials having improved conductivity such as CuFe3P may be employed.

By interaction with the arrangement of the first lateral area 5 in the middle between the conductor paths 3 according to FIG. 5, optimum force distribution and symmetric force application via the surface area 2 to the soldering area and, resp., the soldering points to the conductor paths 3 are further ensured by the design of the surface area 2 according to FIG. 6 or 7. Undesired breakage of one of the soldering points of the soldering area is efficiently avoided. Even in the case of extreme mechanical and thermal load of the circuit board 7 in response to the respective application, a significantly longer service life can be achieved by the fuse element 1 according to the invention.

As a result, in the fuse element 1 the function of a thermal fuse is achieved, on the one hand, by the elastic material and, on the other hand, by the appropriate shaping described in detail before as well as by the option to fasten the fuse element 1 in the afore-described manner on a circuit board. Due to the specific design of the fuse element 1 and the arrangement thereof on the circuit board 7 according to the present invention, over the entire extension of the fuse element preferably made from a metallic strip the desired elastic spring force (triggering force) is generated in the direction illustrated by the second arrow P2.

Safe lifting of the surface area 2 off the conductor paths 3 is guaranteed even after a rather long useful life of the fuse element 1 and the arrangement on the circuit board 7. Further requirements for fastening the fuse element 1 on the circuit board are not existing, and the fuse element 1 will be reliably retained on the circuit board 7 even after triggering. Repeated connection of the conductor paths 3 after triggering will not occur.

In the foregoing, the present invention has been described in detail by way of example embodiments with reference to the Figures. All embodiments and variants as described above are deemed to belong to the invention.

The invention claimed is:

1. A fuse element for an electric circuit, arranged on a circuit board of the electric circuit, the fuse element comprising:
   a surface area for fastening and establishing an electric contact of the fuse element on the circuit board,
   a first deforming area adjacent to the surface area,
   a second deforming area which is connected to the first deforming area via a central area, and wherein the second deforming area includes a contact area by which the fuse element abuts on the circuit board, and
   a hook-shaped element formed on the second deforming area and being insertable into an opening in the circuit board disposed adjacent to the contact area of the second deforming area, wherein
   the hook-shaped element is insertable into the opening of the circuit board by elastic deformation of the fuse element in the direction of the circuit board, and
   due to an elastic bias of the hook-shaped element toward the second deforming area after inserting the hook-shaped element into the opening and positively holding the hook-shaped element on a lower surface of the circuit board adjacent to the opening, the first and second deforming areas exert an elastic force upon the surface area in the direction away from the circuit board.

2. The fuse element according to claim 1, wherein the second deforming area includes two juxtaposed strip-shaped parts including a space therebetween and the intermediate area between the strip-shaped parts is cut free and bent outwards to form the hook-shaped element.

3. The fuse element according to claim 1, wherein a hook-shaped end of the hook-shaped element in the state prior to mounting the fuse element on the circuit board is located adjacent to the contact area and after insertion into the opening of the circuit board abuts beneath the contact area and with a positive fit on the lower surface of the circuit board.

4. The fuse element according to claim 3, wherein, after insertion of the hook-shaped element into the opening of the circuit board and positive abutment of the hook-shaped end on the lower surface of the circuit board, an elastic clamping force is formed between the contact area and the hook-shaped element with the circuit board located therebetween.

5. The fuse element according to claim 4, wherein the fuse element is integrally formed of a strip-shaped metallic material.

6. The fuse element according to claim 4, wherein the surface area and the contact area are formed in parallel to an upper surface of the circuit board.

7. The fuse element according to claim 1, wherein the surface area is configured so as to interconnect conductor paths of an electric circuit separated after a respective soldering operation and thus to establish contacts.

8. The fuse element according to claim 7, wherein the first deforming area includes a first lateral area which connects the first deforming area to the central area, and wherein prior to inserting the hook-shaped element into the opening in the circuit board the direction of extension of the first lateral area extends through the center between the conductor paths to be connected on the circuit board.

9. The fuse element according to claim 8, wherein the surface area includes long lateral areas extending in a direction of a longitudinal extension and the long lateral areas are folded upwards in the direction of the first lateral area.

10. The fuse element according to claim 1, wherein the second deforming area includes two juxtaposed strip-shaped parts including a space therebetween and the intermediate area between the strip-shaped parts is cut free and bent outwards to form the hook-shaped element.

11. The fuse element according to claim 1, wherein a hook-shaped end of the hook-shaped element in the state prior to mounting the fuse element on the circuit board is located adjacent to the contact area and after insertion into the opening of the circuit board abuts beneath the contact area and with a positive fit on the lower surface of the circuit board.

12. The fuse element according to claim 3, wherein, after insertion of the hook-shaped element into the opening of the circuit board and positive abutment of the hook-shaped end on the lower surface of the circuit board, an elastic clamping force is formed between the contact area and the hook-shaped element with the circuit board located therebetween.

13. The fuse element according to claim 4, wherein the fuse element is integrally formed of a strip-shaped metallic material.

14. A fuse element for an electric circuit, wherein the fuse element is configured to be arranged on a circuit board of the electric circuit, comprising
   a surface area for fastening and establishing an electric contact of the fuse element on the circuit board,
   a first deforming area adjacent to the surface area,
   a second deforming area which is connected to the first deforming area via a central area, and wherein the second deforming area includes a contact area by which the fuse element abuts on the circuit board, and
   a hook-shaped element formed on the second deforming area and being insertable into an opening in the circuit board disposed adjacent to the contact area of the second deforming area, wherein
   the hook-shaped element is insertable into the opening of the circuit board by elastic deformation of the fuse element in the direction of the circuit board, and
   after inserting the hook-shaped element into the opening and positively holding the hook-shaped element on a lower surface of the circuit board adjacent to the opening due to an elastic bias of the hook-shaped element, the first and second deforming areas exert an elastic force upon the surface area in the direction away from the circuit board.

15. A fuse element for an electric circuit, arranged on a circuit board of the electric circuit, the fuse element comprising:
- a surface area for fastening and establishing an electric contact of the fuse element on the circuit board,
- a first deforming area adjacent to the surface area,
- a second deforming area which is connected to the first deforming area via a central area, and wherein the second deforming area includes a contact area by which the fuse element abuts on the circuit board, and
- a hook-shaped element formed on the second deforming area and being insertable into an opening in the circuit board disposed adjacent to the contact area of the second deforming area, wherein
- the hook-shaped element is insertable into the opening of the circuit board by elastic deformation of the fuse element in the direction of the circuit board, and
- after inserting the hook-shaped element into the opening and positively holding the hook-shaped element on a lower surface of the circuit board adjacent to the opening, the first and second deforming areas exert an elastic force upon the surface area in the direction away from the circuit board, and
- wherein the surface area is configured so as to interconnect conductor paths of an electric circuit separated after a respective soldering operation and thus to establish contacts, and
- wherein the first deforming area includes a first lateral area which connects the first deforming area to the central area, and wherein prior to inserting the hook-shaped element into the opening in the circuit board the direction of extension of the first lateral area extends through the center between the conductor paths to be connected on the circuit board.

16. A fuse element for an electric circuit, arranged on a circuit board of the electric circuit, the fuse element comprising:
- a surface area for fastening and establishing an electric contact of the fuse element on the circuit board,
- a first deforming area adjacent to the surface area,
- a second deforming area which is connected to the first deforming area via a central area, and wherein the second deforming area includes a contact area by which the fuse element abuts on the circuit board, and
- a hook-shaped element formed on the second deforming area and being insertable into an opening in the circuit board disposed adjacent to the contact area of the second deforming area, wherein
- the hook-shaped element is insertable into the opening of the circuit board by elastic deformation of the fuse element in the direction of the circuit board, and
- after inserting the hook-shaped element into the opening and positively holding the hook-shaped element on a lower surface of the circuit board adjacent to the opening, the first and second deforming areas exert an elastic force upon the surface area in the direction away from the circuit board, and
- wherein prior to inserting the hook-shaped element into the opening in the circuit board the central area extends substantially in the same direction as the surface area, and thus extends approximately along the surface area, and hence along and, respectively in parallel to the circuit board to which the fuse element is attached.

* * * * *